United States Patent
Houston

(10) Patent No.: US 7,158,402 B2
(45) Date of Patent: Jan. 2, 2007

(54) ASYMMETRIC STATIC RANDOM ACCESS MEMORY DEVICE HAVING REDUCED BIT LINE LEAKAGE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 706 days.

(21) Appl. No.: 10/635,185

(22) Filed: Aug. 6, 2003

(65) Prior Publication Data
US 2005/0041449 A1 Feb. 24, 2005

(51) Int. Cl.
*G11C 11/00* (2006.01)
*G11C 7/02* (2006.01)

(52) U.S. Cl. ........................ 365/154; 365/208; 365/202

(58) Field of Classification Search ................ 365/154, 365/207, 208, 214, 202, 205
See application file for complete search history.

(56) References Cited

U.S. PATENT DOCUMENTS

| | | | |
|---|---|---|---|
| 4,366,559 A * | 12/1982 | Misaizu et al. ............. | 365/205 |
| 4,584,671 A | 4/1986 | Monk | |
| 5,446,699 A * | 8/1995 | Naiki ..................... | 365/230.04 |
| 6,262,912 B1 * | 7/2001 | Sywyk et al. ................ | 365/156 |
| 6,442,061 B1 * | 8/2002 | Kong et al. .................. | 365/154 |
| 6,519,176 B1 * | 2/2003 | Hamzaoglu et al. ........ | 365/154 |
| 6,731,566 B1 * | 5/2004 | Sywyk et al. .......... | 365/230.05 |
| 6,898,111 B1 * | 5/2005 | Yamauchi .................... | 365/154 |
| 2003/0076721 A1 | 4/2003 | Forbes | |
| 2005/0226031 A1* | 10/2005 | Najm et al. ................. | 365/154 |

OTHER PUBLICATIONS

Navid Azizi et al., "Low-Leakage Asymmetric-Cell SRAM" ISLPED '02, Aug. 12-14, 2002, Monterey, California, USA.

* cited by examiner

*Primary Examiner*—Amir Zarabian
*Assistant Examiner*—Michael Weinberg
(74) *Attorney, Agent, or Firm*—Rose Alyssa Keagy; W. James Brady; Frederick J. Telecky, Jr.

(57) ABSTRACT

An SRAM device comprising a column having opposing bit lines, asymmetric memory cells spanning the opposing bit lines in alternating orientations, and a sense amplifier. The sense amplifier includes sensing circuitry configured to sense values stored in the cells and switching circuitry configured to apply signals to the sensing circuitry as a function of the orientations.

22 Claims, 2 Drawing Sheets

ASYMMETRIC STATIC RANDOM ACCESS MEMORY DEVICE HAVING REDUCED BIT LINE LEAKAGE

TECHNICAL FIELD OF THE INVENTION

The present invention is directed, in general, to memory devices and, more specifically, to a Static Random-Access Memory (SRAM) device having reduced bit line leakage.

BACKGROUND OF THE INVENTION

Memory devices are known in the art and used in, among other things, virtually all microprocessor and digital signal processor applications. One such type of memory is SRAM. SRAM devices are fast and easy to use compared to many other types of memory devices, in part because they do not have to be frequently refreshed to maintain their contents. In addition, SRAM devices that use metal-oxide-semiconductor (MOS) technology exhibit relatively low standby power and do not require a refresh cycle to maintain stored information. These attributes make SRAM devices particularly desirable for portable equipment, such as laptop computers and personal digital assistants.

SRAM devices typically comprise columns of memory cells that span opposing bit lines (termed "bit" and "bit_"). The bit lines couple the memory cells to a sense amplifier that senses values stored in the cells. To sense the value stored in a cell, both the bit line and the bit_line are pre-charged to a predetermined voltage (termed $V_{DD}$, which is a power supply voltage of the SRAM device), and the cell being read reduces the voltage of either the bit line or the bit_line based on the value stored in the cell. The sense amplifier determines which of the bit line or the bit_line is biased higher and generates a corresponding signal. Typically, the voltage difference between the bit line and bit_line voltage signals ranges between 50 mV and 100 mV. That is, as the voltage difference decreases to less than about 50 mV, it becomes increasingly difficult to discriminate accurately between the bit line and bit_line signals.

A continuing concern with SRAM (and most other MOSFET) devices is current leakage when transistor gates in the devices are biased in the off state. For example, current leakage from multiple cells in a given column can undesirably aggregate on the bit line or bit_line, whichever the case may be. During a READ, the opposing bit lines are both precharged to a high voltage and then one or the other is pulled low by the READ current of the addressed memory cell, depending on the state of the address memory cell. Thus a differential voltage is established on the opposing bit lines and the sense of the differential reflects the state of the addressed memory cell. At the same time as the READ current from the addressed memory cell is lowering the voltage of one of the bit lines, the leakage current from the unaddressed cells is lowering the voltage of the bit lines, again depending on the state for the unaddressed memory cells. If the majority of the leakage current is to the bit line opposite to the bit line being pulled low by the addressed memory cell, the leakage current will delay the establishment of a differential voltage adequate for sensing. In fact, if the aggregate of the leakage current to the opposite bit line is equal to or greater than the READ current, a proper differential will never be established. Current leakage therefore has the effect of prolonging the time required to accrue a sufficient voltage differential between the bit line and bit_line values so the sense amplifier can act.

Those skilled in the art understand that transistors having relatively higher threshold voltages experience relatively less current leakage. However, such transistors also experience relatively slower switching speeds that may be below design objectives. It thus follows that transistors having threshold voltages that are lower than optimal values for low leakage are required to meet switching speed requirements. Unfortunately, transistors having lower threshold voltages require significantly greater power due to much higher current leakage. In an attempt to overcome this dichotomy between fast switching transistors and those that experience less current leakage and require less power, designers have developed asymmetric SRAM cells in which one or more columns have higher threshold transistors connected to one bit line and lower threshold transistors connected to an opposing bit line.

For example, transistors on a "slow" side of a given column may have a high threshold voltage and thus a lower READ current but also a lower leakage to the bit line, and transistors on a "fast" side of the column may have a low threshold voltage and thus a larger READ current but also a larger leakage current to the bit line. In an attempt to compensate for the disproportionate READ current (and thus a disproportionate time to establish a given voltage differential between the bit lines), existing sense amplifiers have been configured to anticipate which of the bit lines is coupled to the fast or slow side of the memory cell. Accordingly, despite the requirement for special sense amplifiers, such configurations may result in an improved device wherein the balance between the power savings of high threshold transistors and the speed of low threshold transistors can be optimized.

However, the effect of the leakage current compared to the READ current must be taken into account. For example, consider an SRAM column with symmetrical cells. If the sense amplifier is trying to read a "one" (high voltage level) out of one cell in a column of 512 cells, and the 511 remaining cells are "zeros" (low voltage levels), the leakage from the 511 cells not being accessed affects the read time on the accessed cell based on the $I_{ON}$:$I_{OFF}$ ratio of the pass gates. If the $I_{ON}$:$I_{OFF}$ ratio were about 100:1, the current leakage from 100 cells equals the current of the one cell actually being accessed. Accordingly, it would be difficult to have more than about 64 rows in the column (64 being the highest number that is a power of two that is less than 100); the resulting device would be impractically slow.

However, if the $I_{ON}$:$I_{OFF}$ ratio were about 1000:1 (which is a more realistic worst case), the current leakage from 500 non-accessed cells would be about 50% of the current read from a single cell, thereby doubling the amount of time that it takes to read the accessed cell. The limitation in the number of rows caused by leakage current can be worse for the asymmetrical cell case where there is a fast bit line and a slow bit line. The READ current on the slow side must be compared to the leakage current on the fast side. If the aggregate leakage on the fast side (which has high leakage) is greater than the READ current on the slow side (which has the low READ current), a READ error may occur. Obviously, this would eliminate the advantage of having an asymmetrical cell.

Thus, cumulative current leakage in long columns of memory cells can negate the speed advantage of having relatively low threshold voltage transistors in the memory cells. Consequently, current leakage restricts the number of rows that may be included in a memory device that uses low threshold transistors. What is needed in the art is a way to accommodate more rows in a column of memory cells.

SUMMARY OF THE INVENTION

To address the above-discussed deficiencies of the prior art, the present invention provides an SRAM device comprising a column having opposing bit lines, asymmetric memory cells spanning the opposing bit lines in alternating orientations, and a sense amplifier. The sense amplifier includes sensing circuitry configured to sense values stored in the cells and switching circuitry configured to apply dummy bit signals to the sensing circuitry as a function of the alternating orientations.

The present invention therefore introduces an SRAM device having reduced bit line leakage. That is, by alternating the orientations of the asymmetric cells, such as by fast and slow access speeds, the worst case current leakage along at least one of the opposing bit lines may be reduced by about 50%. Moreover, the differing access speeds associated with the alternately oriented memory cells may be optimized by employing the switching circuitry to bias the sense amplifier to increase the slower access speed.

In one embodiment, the memory cells span only two opposing bit lines. However, the principles of the present invention are equally applicable to multi-ported SRAM devices in which each column may span more than one pair of opposing bit lines.

In one embodiment, the dummy bit signals comprise different voltage signals and the dummy bit line switching circuitry is configured to apply the different voltage signals to opposing sides of the sensing circuitry. For example, the dummy bit signals may include a first signal that follows one of the opposing bit lines and a second signal that follows a device power supply voltage. Of course, the dummy bit signals may comprise other and/or additional signals within the scope of the present invention.

In one embodiment, the orientations of the cells alternate based on a power of two. For example, every odd-numbered cell may be disposed in a first orientation and every even-numbered cell may be disposed in a second orientation. Similarly, the cells may be disposed in groups of two cells (or four cells, or eight cells, etc.) each having the same orientation, wherein the orientation of a first group of cells alters from the orientation of a neighboring group of cells.

In one embodiment, the orientations of the cells are based on threshold voltages of said cells. For example, a memory cell may be disposed in a first orientation wherein the transistors associated with a connected bit line have a higher threshold voltage than the transistors associated with a connected bit_line, whereas a neighboring cell may be disposed in a second orientation wherein the transistors having the higher threshold voltage are connected to the bit_line and the transistors having the lower threshold voltage are connected to the bit line. Those skilled in the art will recognize that other characteristics of the memory cells, such as transistor length or transistor width, may be employed to differentiate between multiple orientations. For example, a relatively wider pass gate connected to the bit line and a relatively narrower pass gate connected to the bit_line can provide an asymmetry in drive current and leakage current to bit and bit_. The width of the transistors in the inverters associated with the pass gates may also be asymmetrical, with wider transistors in the inverter driving the wider pass gate.

In one embodiment, the dummy bit line switching circuitry receives a signal representing the orientations from a line of an address bus associated with the SRAM device. For example, if the orientations of the memory cells alternate with each neighboring cell, the first bit in the address line corresponding to the cell being accessed may be employed by the switching circuitry. Similarly, if the orientations of the memory cells alternate in groups of two, the second bit in the address line may be employed by the switching circuitry. Those skilled in the art will readily recognize that additional addressing schemes may be employed within the scope of the present invention, such that more than one bit from the address line may be received and employed by the switching circuitry.

In one embodiment, the number of asymmetric memory cells in the column is a power of two. For example, the column may include 512 memory cells of alternating orientations. However, the principles of the present invention apply to SRAM devices having column(s) of any number of cells.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
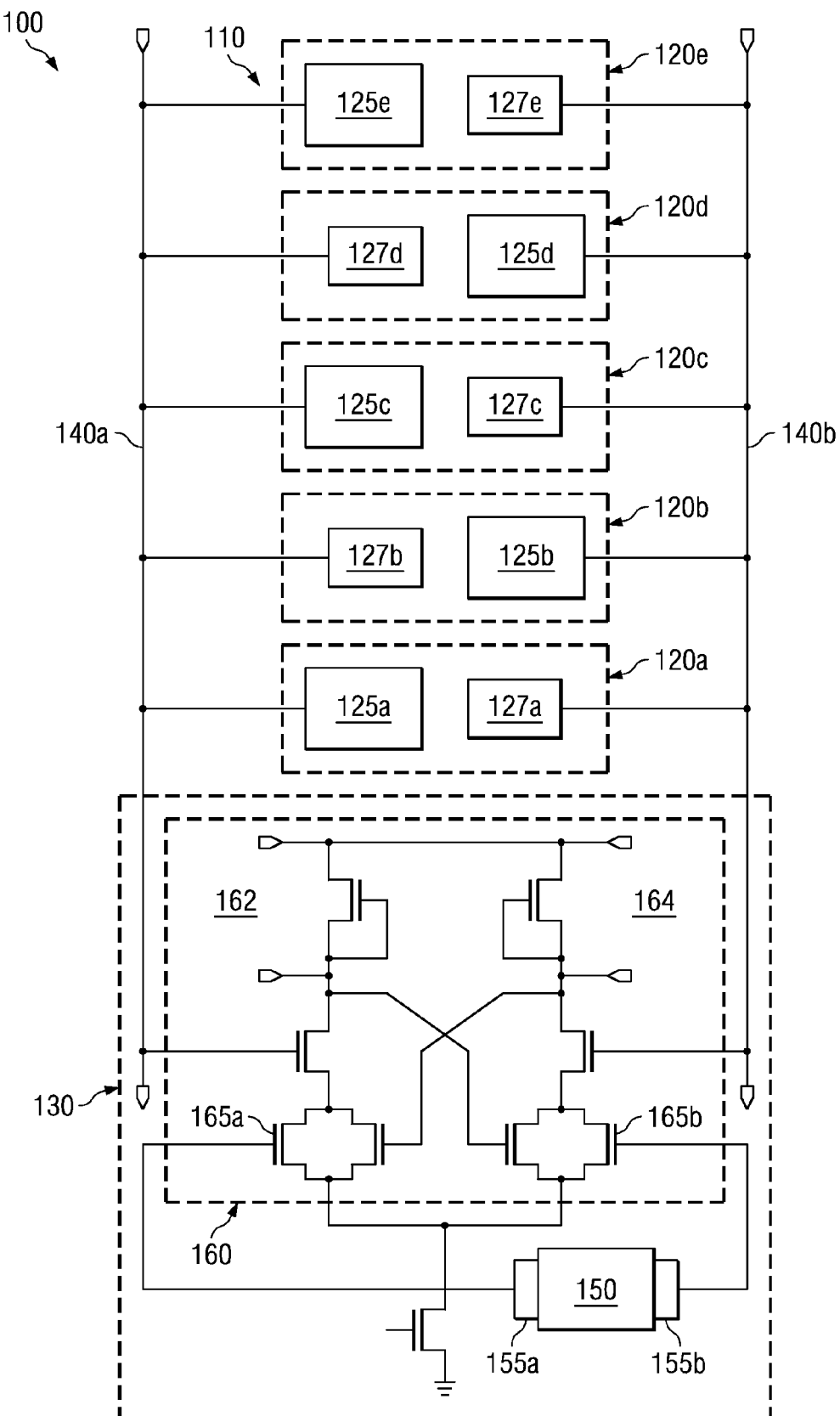
FIG. 1 illustrates a circuit diagram of an embodiment of an SRAM device constructed according to the principles of the present invention.

Referring initially to FIG. 1, illustrated is a circuit diagram of an embodiment of an SRAM device 100 constructed according to the principles of the present invention. The SRAM device 100 includes a column 110 of asymmetric memory cells 120a–120e, a sense amplifier 130 and at least a pair of opposing bit lines 140a, 140b. Of course, the column 100 may include more than the five asymmetric memory cells 120a-120e shown in FIG. 1, such that they may be collectively referred to herein as asymmetric memory cells 120. In fact, the column 110 may include any number of asymmetric memory cells 120 according to the principles of the present invention. Those skilled in the art will recognize that, in some embodiments, the column 110 may include a number of asymmetric memory cells 120 that is a power of two, such that existing binary addressing techniques may be employed.

Those skilled in the art will also recognize that the present invention does not limit the number of columns 110 to one, such that the SRAM device 100 may comprise more than one column. In fact, real-world SRAM devices would be expected to have many columns, often numbered as a power of two, optionally with a multiplexing of a sense amplifier among multiple columns. Moreover, although not illustrated as such, the principles of the present invention may be applied to SRAM devices incorporating more than one pair of opposing bit lines 140a, 140b per column 110, such that the SRAM device 100 may be a multi-port device, as known in the art.

The asymmetry of each of the asymmetric memory cells 120 is illustrated in FIG. 1 by a fast side and a slow side. For example, the asymmetric memory cell 120a has a fast side 125a and a slow side 127a. Such asymmetry establishes a "fast" and "slow" read direction for each memory cell 120. For example, the fast read direction for the memory cell 120 is via the bit line 140a, whereas the slow read direction is via the bit_line 140b. As described above, the waiting period required for establishing a given differential voltage in the slow read direction can be more than twice as long as that required for establishing the same given differential voltage in the fast read direction. The sense amplifier designed for this disparity, with knowledge of which is the slow side, allows sensing either direction with the same fast delay.

In one embodiment, transistors on the fast side of each memory cell 120 (e.g., side 125a of cell 120a) may have a lower threshold voltage than transistors on the slow side (e.g., side 127a). In one embodiment, transistors on the fast side may have a larger gate width than transistors on the slow side. Of course, there are other means for differentiating opposing sides of the asymmetric memory cells 120 within the scope of the present invention, in addition to or in cooperation with the exemplary means described above. Moreover, the principles of the present invention may be readily adapted to an asymmetric memory device having more than two alternating orientations.

As mentioned above, the SRAM device 100 also includes a bit line 140a and an opposing bit_line 140b. The asymmetric memory cells 120 span the bit lines 140a, 140b, such that each memory cell 120 is connected on one side to the bit line 140a and connected on the other side to the bit_line 140b. However, as shown in FIG. 1, the asymmetry of the memory cells 120 is arranged in alternating orientations with regard to how each is connected to the opposing bit lines 140a, 140b. For example, the asymmetric memory cells 120a, 120c and 120e may have fast sides 125a, 125c and 125e connected to the bit line 140a and slow sides 127a, 127c and 127e connected to the opposing bit_line 140b, whereas the asymmetric memory cells 120b and 120d may have slow sides 127b and 127d connected to the bit line 140a and fast sides 125b and 125d connected to the opposing bit_line 140b.

The orientations of the asymmetry of the memory cells 120 may be based on a power of two, as shown in FIG. 1, such that the orientation of similarly oriented memory cells 120 may be determined by a single binary address bit. For example, as in the illustrated embodiment, every other memory cell may have a fast side connected to the bit line 140a and a slow side connected to the bit_line 140b, such that the orientation of a particular memory cell 120 may be determined by the first bit of the binary address for that cell 120. In another embodiment, the orientations may be by groups of two, such that each memory cell 120 is neighbored on one side by a memory cell 120 that is similarly oriented and neighbored on the other side by a memory cell 120 that is alternately oriented. In such an embodiment, the orientation of a particular memory cell 120 may be determined by the second bit of the binary address for that cell 120. However, the scope of the present invention is not limited to such binary or base-two alternating orientations. For example, more complex patterns of alternating orientations may be employed, although such orientations may require more than one address bit to determine the orientation of a particular memory cell 120.

By alternately orienting the memory cells 120, the maximum current leakage along the bit lines 140a, 140b may be reduced. That is, conventional asymmetric memory cells in which all of the cells are similarly oriented (having fast sides connected to a common bit line and slow sides connected to an opposing common bit line) permit all of the current leakage from the fast side to aggregate to a single bit line. As discussed above, this can lead to a false result if the aggregate leakage on the fast side is greater than the read current on the slow side. However, by alternating the orientations, such that substantially equal numbers of fast and slow sides of cells are connected to a common bit line, the worst-case aggregate current leakage along that bit line may be reduced by about 50%. Of course, the number of cells in each of the alternating orientations may not be equal, such that the worst-case aggregate current leakage along a bit line may be reduced by less than about 50%.

Put another way, conventional asymmetric memory cells experience a disproportionate amount of current leakage on one of the opposing bit lines, because that bit line is connected to the fast sides of all the memory cells in the column, and the fast sides experience greater current leakage than the slow sides. However, if a bit line is connected to the fast sides of about half of the cells in a column and connected to the slow sides of the remaining cells in the column, then the current leakage experienced by that bit line can be reduced by about 50%, or substantially balanced for the worse case. Accordingly, the SRAM device 100 of the present invention advantageously reduces the current leakage through at least one of the opposing bit lines 140a, 140b.

Of course, the benefit of such alternating asymmetric orientations may be fully realized with a special sensing amplification arrangement. For example, the row address of the particular memory cell 120 being accessed may be employed to anticipate whether the fast or slow side of the cell is pulling down one of the bit lines 140a, 140b. That is, whereas conventional asymmetric SRAM devices employed one bit line as "fast" and the other bit line as "slow," the alternating asymmetric orientations of the present invention are row dependent. Consequently, it may be advantageous to employ sensing amplification which is modified based on the particular row being accessed.

Accordingly, the sense amplifier 130 shown in FIG. 1 includes switching circuitry 150 coupled to sensing circuitry 160. For the sake of clarity, the switching circuitry 150 will be described below with reference to FIG. 2.

The sensing circuitry 160 is configured to sense values stored in the memory cells 120. In that regard, a substantial portion of the sensing circuitry 160 may be conventional, such that detailed description thereof is not provided herein. However, one factor distinguishing the sensing circuitry 160 of the present invention from that of the prior art is the inclusion of transistors 165a, 165b connected to outputs 155a, 155b of the switching circuitry 150. As will be described below with reference to FIG. 2, the outputs 155a, 155b are configured to be switched between a dummy bit voltage and a higher voltage (such as $V_{DD}$, a device power supply voltage), based on the orientation of the particular memory cell 220 being accessed. By switchably biasing the transistors 165a, 165b at the different voltages provided by the switching circuitry 150, the sense amplifier 130 can be biased to give a result in the slow direction if a differential has not been established in the fast direction, where fast and slow directions are determined by the row addressed.

As with the memory cells 120, the sensing circuitry 160 may include opposing sides, such as a first side 162 and a second side 164, which may be discernable by the locations of the transistors 165a, 165b. However, the first and second sides 162, 164 of the sensing circuitry 160 may not necessarily mean that the transistors 165a, 165b are distinguishable from one another by differing threshold voltages, gate widths or access speeds. More specifically, the first and second sides 162, 164 of the sensing circuitry 160 may be discernable by their connection to the bit lines 140a, 140b. For example, in the illustrated embodiment, the physical side of the sensing circuitry 160 to which the bit line 140a is connected may be the first side 162 and the sensing circuitry 160 side that is connected to the bit_line 140b may be the second side 164.

Figure 2:
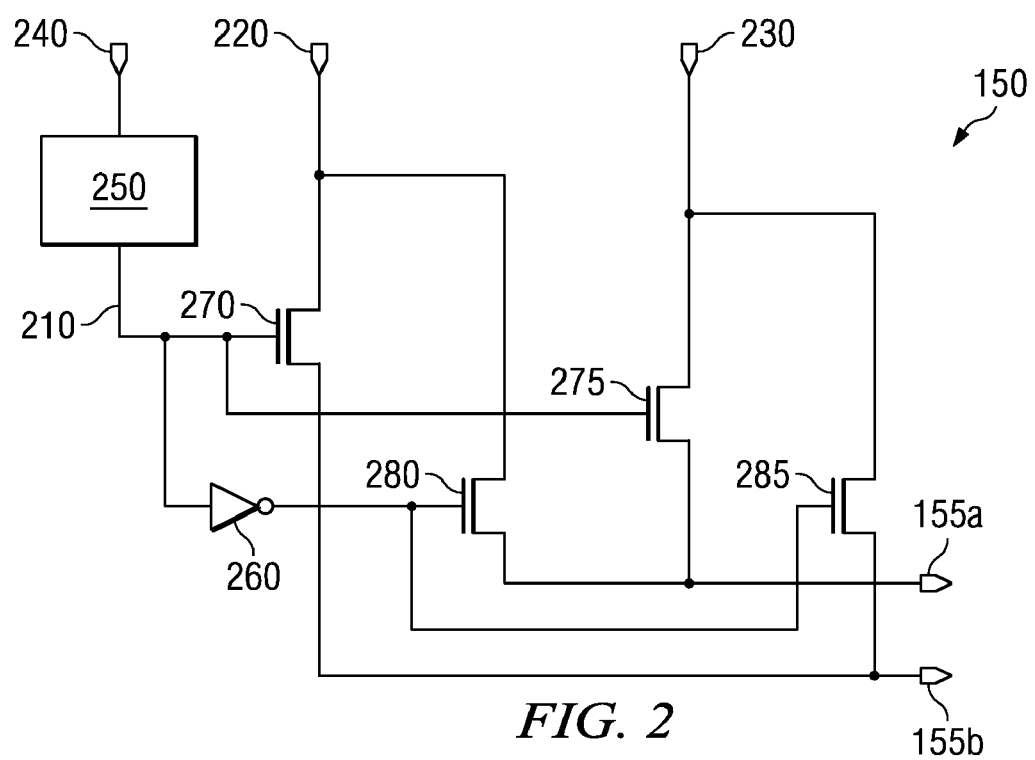
FIG. 2 illustrates a circuit diagram of an embodiment of switching circuitry constructed according to the principles of the present invention.

Turning to FIG. 2, with continued reference to FIG. 1, illustrated is a circuit diagram of an embodiment of the switching circuitry 150 constructed according to the principles of the present invention. As discussed above, the switching circuitry 150 is configured to apply dummy bit signals to the sensing circuitry 160 shown in FIG. 1 as a function of the alternating asymmetric orientations of the memory cells 120.

In general, the switching circuitry 150 is configured to switch high and low voltage signals that are applied to the sensing circuitry 160 shown in FIG. 1. More specifically, the switching circuitry is configured to switch between: (1) applying a high voltage signal to the transistor 165a and a low voltage signal to the transistor 165b; and (2) applying the low voltage signal to the transistor 165a and the high voltage signal to the transistor 165b. Accordingly, the diagram shown in FIG. 2 is merely an example of how such switching may be achieved. Those skilled in the art will readily recognize that there are myriad other means for achieving such voltage signal switching.

In the embodiment shown in FIG. 2, the switching circuitry 150 includes an address input 210, a dummy bit input 220, a high voltage input 230, the dummy bit output 155a and the dummy bit_output 155b. In general, the switching circuitry 150 applies the dummy bit input 220 voltage to one of the dummy bit output 155a and the dummy bit_output 155b, and applies the high voltage input 230 to the other of the dummy bit output 155a and the dummy bit_output 155b, based on the value of the address input 210.

The address input 210 may be a "zero" value (low voltage signal) or a "one" value (high voltage signal) taken from a line of an address bus 240 associated with the SRAM device 100. Accordingly, the switching circuitry may include or be coupled to addressing circuitry 250 that gathers the address input 210 from the address bus 240. For example, if the asymmetric orientations alternate by each neighboring memory cell 120, the address input 210 may be the value of the first bit of the address of the memory cell 120 being accessed. In another embodiment, if the asymmetric orientations alternate by groups of two neighboring memory cells 120, the address input 210 may be the value of the second bit of the address. In another embodiment, if the asymmetric orientations alternate by groups of four neighboring memory cells 120, the address input 210 may be the value of the third bit of the address. In the preceding, the association of specific address bits with specific row order is given as an example. Those familiar with the art know that the decoding of the address bits can be design specific. Of course, other alternating orientation schemes may employ more than one bit from the memory cell 120 address within the scope of the present invention.

The dummy bit input 220 may alternate between high and low voltages in a fashion similar to a conventional bit line. For example, the dummy bit input 220 may follow, be connected to or otherwise be the same as one of the bit lines 140a, 140b. Accordingly, the dummy bit input 220 may fluctuate between a voltage between zero volts and a device power supply voltage $V_{DD}$.

The high voltage input 230 may be maintained at a substantially constant voltage that is equal to or higher than the maximum value of the dummy bit input 220. For example, the high voltage input 230 may be connected to the device power supply voltage $V_{DD}$.

The switching circuitry 150 also includes an inverter 260 and four pass gate transistors 270, 275, 280 and 285. Those skilled in the art will recognize that complimentary pass gates could be used in place of the n-channel pass gates. The inverter 260 is connected to the address input 210 and is configured to provide a low voltage signal ("zero") if the address input 210 is a high voltage signal ("one") and provide a high voltage signal ("one") if the address input 210 is a low voltage signal ("zero"). The gates of the pass gate transistors 270 and 275 are connected to the address input 210, and the gates of the pass gate transistors 280 and 285 are connected to the output of the inverter 260. Accordingly, those skilled in the art will recognize that if the address input 210 value is high ("one"), the high voltage input 230 will be provided at the dummy bit output 155a, and the dummy bit input 220 will be provided at the dummy bit_output 155b, and if the address input 210 value is low ("zero"), the dummy bit input 220 will be provided at the dummy bit output 155a, and the high voltage input 230 will be provided at the dummy bit_output 155b.

Accordingly, the predetermined alternating orientations of the asymmetric memory cells 120 may be employed as the address input 210 to determine which side of a particular memory cell 120 being accessed is the fast or slow side. Subsequently, the high voltage input 230 may be applied to the transistor 165a or 165b corresponding to the fast side of the cell 120 and the dummy bit input 229 may be applied to the transistor 165a or 165b corresponding to the slow side of the cell 120. As discussed above, such biasing may operate to optimize the previously varying access speeds of opposing bit lines by increasing the slower access speed.

Of course, if the number of different orientations of the memory cells 120 exceeds two, those skilled in the art will recognize that the switching circuitry 150 may be correspondingly adapted to apply more than two dummy bit signals to the sensing circuitry 160. In such embodiments, two or more of the dummy bit signals may be the same or be provided by the same input.

Although the present invention has been described in detail, those skilled in the art should understand that they can make various changes, substitutions and alterations herein without departing from the spirit and scope of the invention in its broadest form.

What is claimed is:

1. An SRAM device, comprising:
    a column of asymmetric memory cells spanning opposing bit lines in alternating orientations; and
    a sense amplifier including:
        sensing circuitry configured to sense stored values in said cells; and
        switching circuitry configured to adapt the sensing circuitry as a function of said orientations.

2. The SRAM device as recited in claim 1 wherein said column has only two of said opposing bit lines.

3. The SRAM device as recited in claim 1 wherein said switching circuitry is configured to apply different voltage signals to opposing sides of said sensing circuitry.

4. The SRAM device as recited in claim 1 wherein said orientations alternate based on a power of two.

5. The SRAM device as recited in claim 1 wherein said orientations are based on threshold voltages of transistors in said cells.

6. The SRAM device as recited in claim 1 wherein said switching circuitry receives a signal representing said orientations from a line of an address bus associated with said SRAM device.

7. The SRAM device as recited in claim 1 wherein said asymmetric memory cells in said column are of a number that is a power of two.

8. The SRAM device as recited in claim 1 wherein said orientations include first and second opposing orientations and said asymmetric memory cells are disposed equally in said first and second orientations.

9. An SRAM sense amplifier, comprising:
   sensing circuitry configured to sense stored values in a column of asymmetric SRAM cells spanning opposing bit lines in alternating orientations; and
   switching circuitry configured to apply voltage signals to said sensing circuitry of said SRAM sense amplifier as a function of said orientations.

10. The SRAM sense amplifier as recited in claim 9 wherein said column has only two of said opposing bit lines.

11. The SRAM sense amplifier as recited in claim 9 wherein said voltage signals comprise different voltage signals and dummy bit line switching circuitry is configured to apply said different voltage signals to opposing sides of said sensing circuitry.

12. The SRAM sense amplifier as recited in claim 9 wherein said orientations alternate based on a power of two.

13. The SRAM sense amplifier as recited in claim 9 wherein said switching circuitry is configured to receive a signal representing said orientations from a line of an address bus associated with said SRAM cells.

14. A method of manufacturing an SRAM device, comprising:
   providing opposing bit lines;
   configuring a column of asymmetric memory cells to span said opposing bit lines in alternating orientations; and
   coupling a sense amplifier to said opposing bit lines, including:
      configuring sensing circuitry to sense stored values in said cells; and
      configuring switching circuitry to apply signals to said sensing circuitry as a function of said orientations.

15. The method as recited in claim 14 wherein said configuring said column includes configuring said cells to span only two of said opposing bit lines.

16. The method as recited in claim 14 wherein said configuring said switching circuitry includes configuring said switching circuitry to apply different voltage signals to opposing sides of said sensing circuitry.

17. The method as recited in claim 14 wherein configuring said column includes configuring said cell orientations to alternate based on a power of two.

18. The method as recited in claim 14 wherein said configuring said cells includes configuring said cells based on threshold voltages of transistors in said cells.

19. The method as recited in claim 14 wherein said configuring said sensing circuitry includes configuring said sensing circuitry to receive a signal representing said orientations from a line of an address bus associated with said cells.

20. The method as recited in claim 14 wherein said configuring said cells includes configuring a number of said cells that is a power of two.

21. An SRAM device, comprising:
   a first bit line;
   a second bit line;
   a first SRAM cell having a first pass gate connected to said first bit line and a second pass gate wider than said first pass gate connected to said second bit line; and
   a second SRAM cell having a first pass gate connected to said second bit line and a second pass gate wider than said first pass gate connected to said first bit line.

22. The SRAM device as recited in claim 21 further comprising:
   a sense amplifier coupled to said first and second SRAM cells; and
   switching circuitry coupled to said sense amplifier and configured to adapt said sense amplifier as a function of a selection of said first and second SRAM cells.

* * * * *